United States Patent [19]

Hofmann et al.

[11] Patent Number: 5,588,359

[45] Date of Patent: Dec. 31, 1996

[54] METHOD FOR FORMING A SCREEN FOR SCREEN PRINTING A PATTERN OF SMALL CLOSELY SPACED FEATURES ONTO A SUBSTRATE

[75] Inventors: Jim Hofmann; Darryl Stansbury, both of Boise, Id.

[73] Assignee: Micron Display Technology, Inc., Boise, Id.

[21] Appl. No.: 488,704

[22] Filed: Jun. 9, 1995

[51] Int. Cl.⁶ ............................................... B41N 1/24
[52] U.S. Cl. .................... 101/128.21; 101/128.4
[58] Field of Search ............... 101/127, 128.21, 101/128.4, 129; 430/308, 945

[56] References Cited

U.S. PATENT DOCUMENTS

| | | | |
|---|---|---|---|
| 2,500,877 | 3/1950 | Sharples | 101/128.21 |
| 3,643,597 | 2/1972 | Lala | 101/128.21 |
| 3,696,742 | 10/1972 | Parts et al. | 101/128.4 |
| 4,293,451 | 10/1981 | Ross | 252/512 |
| 4,944,826 | 7/1990 | Zollman et al. | 101/128.21 |
| 5,116,642 | 5/1992 | Sekiguchi et al. | 427/96 |
| 5,148,355 | 9/1992 | Lowe et al. | 361/410 |
| 5,151,386 | 9/1992 | Bottari et al. | 437/187 |
| 5,176,076 | 1/1993 | Azuma et al. | 101/123 |
| 5,259,311 | 11/1993 | McCaughey, Jr. | 101/401.1 |

OTHER PUBLICATIONS

Jenczewski, Kathy, "Technical Discussion of Stainless Steel Mesh", Micro–Screen, Apr. 23, 1992.
Rigsby Screen & Stencil, Inc., product literature, Feb., 1993.
Micro–Screen product brochure entitled "Screens For Thick Film Printing", 1994.

Primary Examiner—Stephen R. Funk
Attorney, Agent, or Firm—Stephen A. Gratton

[57] ABSTRACT

A method for forming a screen suitable for screen printing a pattern of small closely spaced features onto a substrate is provided. The method includes the steps of providing a fine mesh screen and then forming a patterning layer on the mesh using a photosensitive emulsion. A mask or phototool is used to pattern the patterning layer. During the patterning process, open areas of the mask are aligned with the openings on the mesh using a microscope or other vision device to align the mask with the mesh. During a screen printing process, the open areas of the patterning layer will thus not be obstructed or split into smaller openings by the screen wires. The patterning layer can be patterned using laser energy directed through the mask or using UV exposure followed by development with a suitable developer.

22 Claims, 2 Drawing Sheets

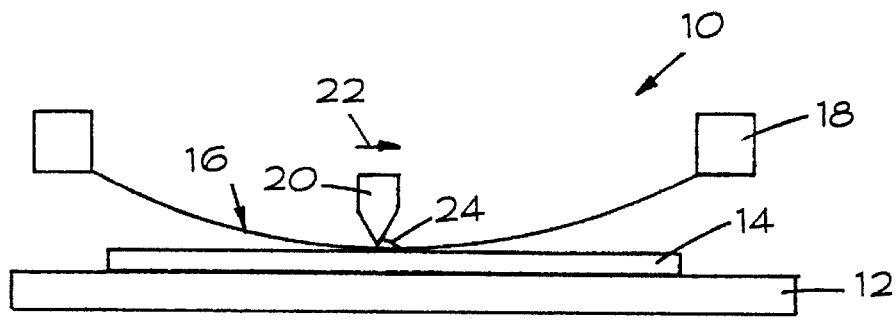
Figure 1
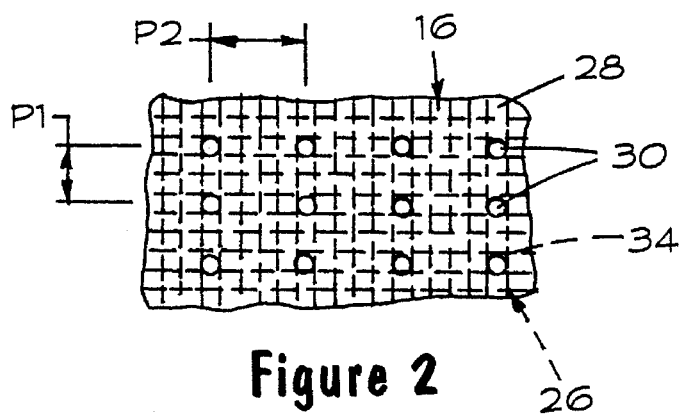
Figure 2
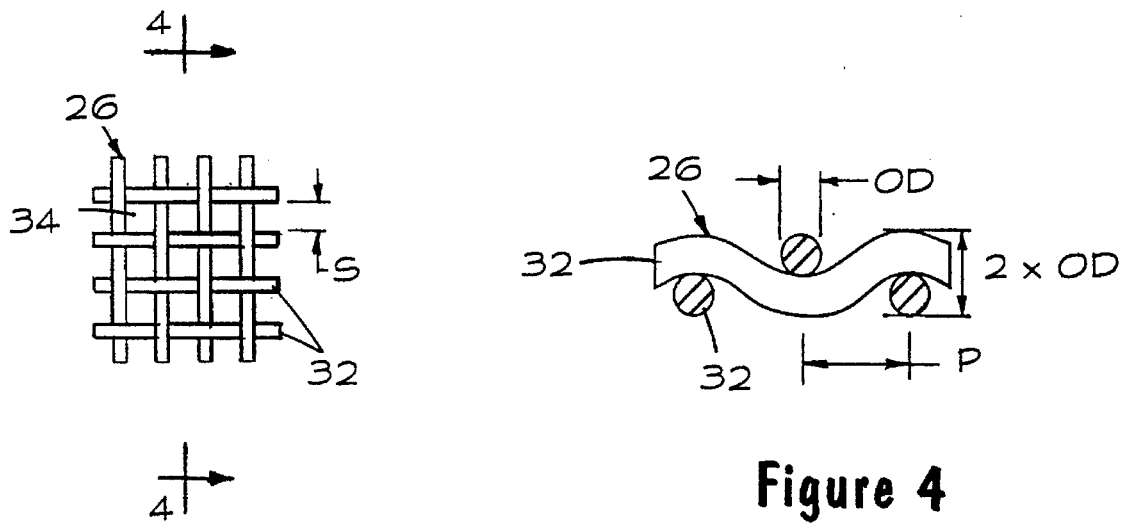
Figure 4
Figure 3

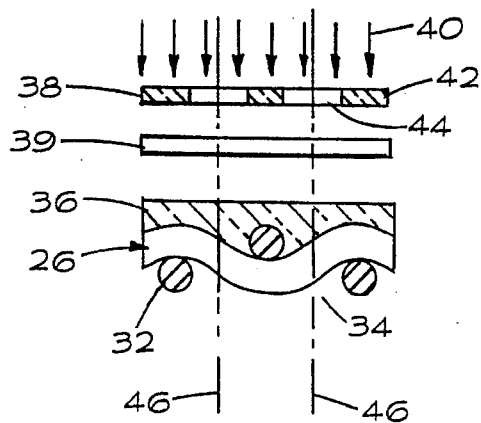
Figure 5
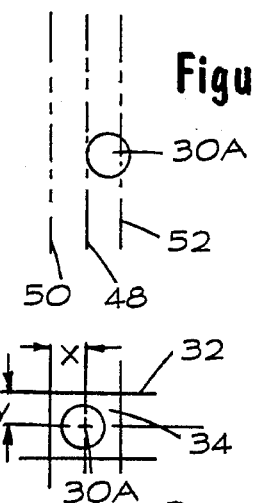
Figure 7A
Figure 7B
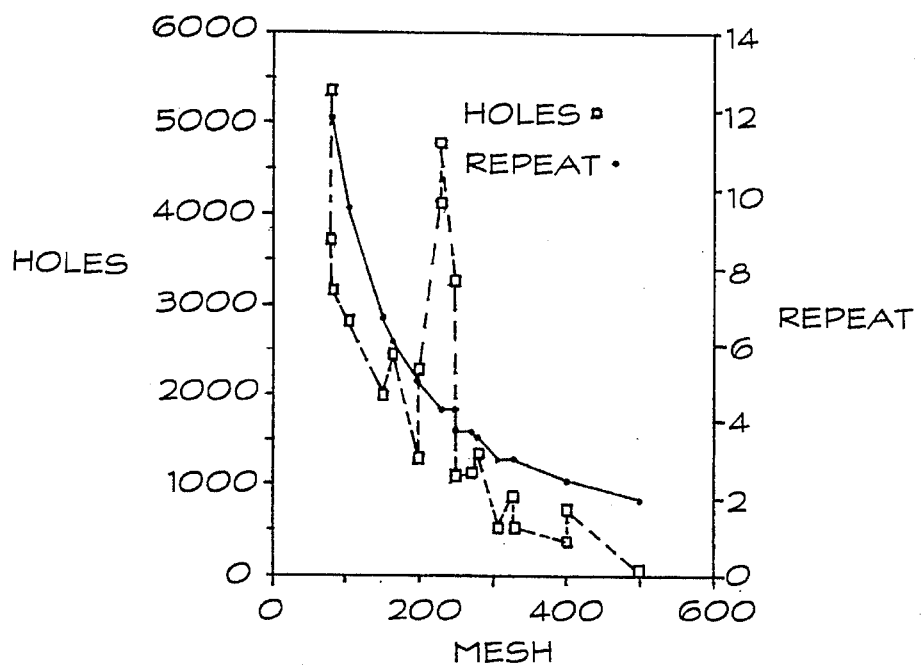
Figure 6

METHOD FOR FORMING A SCREEN FOR SCREEN PRINTING A PATTERN OF SMALL CLOSELY SPACED FEATURES ONTO A SUBSTRATE

This invention was made with Government support under Contract No. DABT63-93-C-0025 awarded by Advanced Research Projects Agency (ARPA). The Government has certain rights in this invention.

FIELD OF THE INVENTION

This invention relates generally to screen printing and more particularly to an improved method and apparatus for screen printing patterns with small closely spaced features. The method of the invention is particularly suited to the fabrication of screen printed electronic devices such as microelectronic components of field emission displays.

BACKGROUND OF THE INVENTION

In the electronics industry screen printing is used to make various components. For example, microelectronic packages called hybrids, or multi-chip modules, utilize circuits and electrical devices made by screen printing. Conductive, resistive and dielectric patterns of a circuit can be formed by screen printing onto a rigid substrate such as a circuit board. Screen printing is also used in the fabrication of field emission displays (FEDs) for flat panel displays. With a FED, the normal topography used to make a hybrid can be multi level due to the gap which is required between the anode and cathode components of the display. This places some additional demands on the screen printing process.

Screen printing for microelectronics is similar to the method used to make t-shirts and printed panels for industrial equipment but at the high end of the technology. A typical screen printing process for a multi level hybrid would be to print a conductive layer, dry the layer and fire. The substrate would then be processed with the next layer, usually a dielectric composition. After dry and fire another layer of conductor would be fired.

With screen printing, a screen is used to deposit a thick-film paste, or other printing material, onto a substrate (e.g., polyimide circuit board, silicon baseplate). Different techniques are used to transfer the desired pattern from a mask containing artwork to the screen.

To produce a screen, a stainless steel or monofilament polyester screen mesh is stretched and attached to a metal frame. A negative pattern must then be generated on the mesh so that the printing material can be forced through the screen to produce a positive pattern for the substrate. A photosensitive emulsion can be used to make the negative pattern on the screen. There are three methods for the application of the emulsion to the mesh: direct, indirect and indirect-direct.

In the direct emulsion method, the emulsion is initially applied to the mesh in a viscous state and then dried. After drying, the emulsion is exposed through a mask using UV light, and then developed under a water jet to form a patterning layer on the mesh. For a negative acting photosensitive emulsion, the exposed regions of the emulsion are polymerized and the mesh is sealed in these regions. Conversely, the unexposed regions of the emulsion are washed away and form open areas on the mesh. For a positive acting photosensitive emulsion, the exposed portions are removed and the unexposed portions of the emulsion are left.

For screen printing the pattern defined by the patterning layer onto a substrate, the substrate is secured to a support platform within a screen printer. The screen is mounted within the screen printer, parallel to the substrate but spaced apart from the substrate with a slight gap. The printing material is then applied to the screen and a squeegee (e.g., rubber blade) is moved across the screen at a constant rate. The squeegee forces the printing material through the open areas of the screen and prints the pattern defined by the patterning layer onto the substrate.

For printing small closely spaced features, fine mesh screens are preferred. The screen mesh count refers to the number of screen openings per linear inch. The width of a screen opening is related to the mesh count and to the diameter of the screen wire by the formula $$W_o = (1 - DM)/M$$

where $W_o$ is the width of the screen opening in inches

D is the diameter of the screen wire in inches

M is the mesh count

By way of example a commercially available 400 mesh screen has a wire diameter of about 0.75 mil (19.05 μm). A 400 mesh screen is formed with square openings that have a width of about 1.75 mil (44.45 μm).

One problem with the screen printing of patterns having small closely spaced features, is that the resolution and spacing of the features of the pattern can be adversely affected by the screen wires. In particular, with a pattern having feature sizes approximately equal to the size of the openings in the mesh, the resolution and spacing of the features can be distorted by the screen wires.

For example, features that are about the size of the screen openings (e.g., 1.75 mils in diameter for a 400 mesh screen) require open areas in the patterning layer that are approximately the same size as the screen openings. If a 0.75 mil (19.05 μm) screen wire intersects an open area of the patterning layer, then the open area is either partially blocked or split into two smaller openings by the screen wire. For a complex pattern with many features these intersections can occur at many places. In general, the interference of the screen wires with the open areas of the patterning layer, distorts some of the features that are transferred onto the substrate. Because of this distortion, conventional screen printing processes cannot be used to successfully print feature sizes that are less than about 4 mils (101.6 μm) in size and spacing.

Another limitation of screens formed for screen printing occurs during the development of the photosensitive emulsion which forms the patterning layer. During a development step, the unexposed material for a negative emulsion, or the exposed material for a positive emulsion, must be cleared from the screen. Clearing out this material is complicated by the presence of the screen wires. Consequently, if the material is not completely cleared, pattern defects can occur.

OBJECTS OF THE INVENTION

Because of the above limitations in screen printing, it is an object of the present invention to provide an improved method for making screens for screen printing and an improved method of screen printing capable of printing small closely spaced features.

It is another object of the present invention to provide an improved method for making screens for screen printing in which a patterning layer formed on the mesh includes open areas that align with the screen openings.

It is yet another object of the present invention to provide an improved method for making a screen using a laser to pattern and clear a photosensitive emulsion from a mesh.

It is yet another object of the present invention to provide an improved method of screen printing that is low cost, simple and compatible with conventional screen printing equipment.

Other objects, advantages and capabilities of the present invention will become more apparent as the description proceeds.

SUMMARY OF THE INVENTION

In accordance with the present invention an improved method for forming a screen for screen printing and an improved method for screen printing using the screen are provided. The screen includes a fine mesh (e.g., 80–500 mesh) and a patterning layer formed on the mesh. The patterning layer includes open areas that are formed in alignment with corresponding screen openings. In an illustrative embodiment, the patterning layer is formed of a photosensitive emulsion that is initially applied to the mesh and then hardened by exposure to a UV source. The photosensitive emulsion is then patterned using a laser directed through a mask. The laser ablates and clears the photosensitive emulsion from the mesh to form the open areas of the pattern. Alternately in place of laser patterning, a standard UV exposure and solvent development process can be used to expose and develop the photosensitive emulsion.

In either case, prior to patterning of the photosensitive emulsion, the mask is aligned with the mesh so that open areas of the patterning layer will be formed in alignment with corresponding screen openings. With the open areas of the patterning layer in alignment with the screen openings, the screen wires do not intersect the open areas. This improves the printed pattern because features defined by the open areas of the patterning layer are not blocked or split by the screen wires. Alignment of the mask and mesh can be effected using a microscope or other vision system used in conjunction with an exposure and alignment tool to manipulate the mask or mesh as required.

The method requires the mesh to be selected with a pitch or frequency for the screen openings that matches the pitch or frequency for the pattern features. In practice not all of the interference between the screen wires and the pattern openings can be eliminated. This is due in part to defects introduced during manufacture of the mesh. One such defect occurs in the repeatability of the screen pattern across different areas of the mesh. For example, the screen wires in one area may be evenly spaced and parallel to one another in that area but not with respect to wires in an adjoining area. The screen frequency can interfere with the pattern frequency to such an extent that a beat frequency will result causing whole areas of the pattern to be blocked. Because of this problem larger mesh sizes (e.g., 80–230) are preferred for some patterns. In addition, a simple algorithm can be used to ascertain an acceptable phase match between the mesh and pattern frequency as an aid in selecting a mesh for a particular pattern.

The method of the invention, broadly stated, includes the steps of: providing a mesh having screen openings of a predetermined size and pitch; selecting a pattern having features spaced apart by an integral multiple of the pitch of the mesh; forming a mask with solid areas and open areas corresponding to the pattern; depositing a photosensitive emulsion on the mesh; aligning the mask with the mesh so that the open areas of the mask align with the screen openings; hardening the photosensitive emulsion by exposure to a UV source; and then patterning the photosensitive emulsion using a laser directed through the mask. The method of the invention forms a screen that can be used for screen printing a substrate using conventional screen printing processes.

BRIEF DESCRIPTION OF THE DRAWINGS

FIG. 1 is a schematic view of a screen printing apparatus for screen printing a pattern with small closely spaced features using a screen formed in accordance with the invention;

FIG. 2 is a plan view of a portion of a screen formed in accordance with the invention;

FIG. 3 is an enlarged plan view of a portion of a mesh suitable for forming a screen in accordance with the invention;

FIG. 4 is an enlarged cross sectional view of the mesh taken along section line 4—4 of FIG. 3;

FIG. 5 is a schematic cross sectional view showing a patterning step during formation of the screen;

FIG. 6 is a graph that plots the total number of holes per square inch (left hand y-axis) available for a pattern of holes 1 mil. in diameter on a 11.67 mil.×8.75 mil spacing along with the number of pattern repeats (right hand y-axis) plotted against a mesh range (x-axis); and FIGS. 7A and 7B are schematic drawings used in an algorithm for picking screens suitable for a particular pattern.

DETAILED DESCRIPTION OF THE PREFERRED EMBODIMENTS

With reference to FIG. 1, a screen printing apparatus 10 suitable for screen printing in accordance with the invention is shown. The screen printing apparatus 10 includes a support platform 12 on which a substrate 14 has been mounted. A predetermined pattern will be screen printed onto the substrate 14. In an illustrative embodiment, the substrate 14 is a baseplate or other component of a field emission display and the pattern is a pattern of glue dots. A screen 16 is stretched across a support frame 18 mounted within the screen printing apparatus 10. In addition, a squeegee 20 is mounted within the screen printing apparatus 10 for movement across the screen 16 in the direction indicated by arrow 22. The squeegee 20 is adapted to force a viscous printing material 24, such as a paste or glue, through the screen 16 and onto the substrate 14.

With reference to FIG. 2, the screen 16 includes a fine mesh 26 and a patterning layer 28 formed thereon. As will be more fully explained, the patterning layer 28 is formed of a patterned photosensitive polymer and includes a pattern of open areas 30 that align with the screen openings in the mesh 26. During the printing process, the viscous printing material 24 (FIG. 1) is placed on the patterning layer 28 and forced by the squeegee 20 (FIG. 1) through the open areas 30 of the patterning layer 28, through the mesh 26 and onto the substrate 14. The open areas 30 are formed in a repetitive pattern having a pitch P1 in one direction and a pitch P2 in an orthogonal direction. As used herein the term pitch also refers to the frequency of the pattern.

With reference to FIG. 3, the mesh 26 includes screen wires 32 interwoven to form screen openings 34. The screen openings 34 have a generally square outer peripheral configuration. The mesh 26 is a fine mesh screen (e.g., 80 to 500 mesh) formed of a material such as stainless steel or a monofilament polyester. This type of fine mesh screen is commercially available from manufacturers such as Rigsby Screen & Stencil, Inc., Torrance, Calif.; Utz Engineering, San Marcos, Calif.; and Micro-Screen, South Bend, Ind.

As shown in FIG. 4, the screen wires 32 are formed with an outside diameter "OD". In addition, the screen openings 34 are formed with a width on each side of "s" (FIG. 3). Table 1 lists the wire mesh specifications for standard mesh count screens.

TABLE 1

WIRE MESH SPECIFICATIONS

| Mesh Mtl Count +/−3% | Wire Diameter (OD) +/−.1 mil | Mesh Opening (s) +/−.1 mil | Open Area % |
|---|---|---|---|
| SS 80 | 3.7 | 8.8 | 49.6 |
| SS 80 | 2.0 | 10.5 | 70.6 |
| SS 105 | 3.0 | 6.5 | 46.9 |
| SS 150 | 2.6 | 4.1 | 37.2 |
| SS 165 | 2.0 | 4.1 | 44.9 |
| SS 200 | 2.1 | 2.9 | 33.6 |
| SS 200 | 1.6 | 3.4 | 46.2 |
| SS 230 | 1.4 | 2.9 | 46.0 |
| SS 230 | 1.1 | 3.2 | 55.0 |
| SS 250 | 1.6 | 2.5 | 36.0 |
| SS 270 | 1.4 | 2.3 | 38.0 |
| SS 280 | 1.2 | 2.4 | 44.1 |
| SS 325 | 1.1 | 2.0 | 41.3 |
| SS 325 | .9 | 2.2 | 50.1 |
| SS 400 | 1.0 | 1.5 | 36.0 |
| SS 400 | .75 | 1.75 | 49.0 |
| SS 500 | .8 | 1.2 | 36.0 |

As also shown in FIG. 4, a pitch "P" or frequency of the mesh 26 is the spacing from center to center of the screen wires 32 (or openings 34). A thickness of the mesh 26 is equal to 2× OD The pitch "P" is equal to the diameter "OD" of the screen wires 32 and the width "s" for the screen openings 34 (P=OD+s).

With reference to FIG. 5, the formation of the patterning layer 28 (FIG. 2) is illustrated. The patterning layer 28 is formed by depositing a photosensitive emulsion 36 on the mesh 26. Suitable compounds for the photosensitive emulsion include photosensitive polymers such as polyvinyl alcohol and polyvinyl acetate. Advantageously, for subsequent alignment processes, these photosensitive materials will generally be translucent or transparent to light.

The photosensitive emulsion 36 is deposited onto the mesh 26 by spin deposition or other suitable deposition process to a thickness of about 1.5 to 20 mils. Following deposition, the photosensitive emulsion 36 can be softbaked by heating. Alternately, meshes precoated with a desired photosensitive formulation to a desired thickness can be purchased from the screen manufacturers previously identified.

In an illustrative embodiment, the photosensitive emulsion 36 is patterned using UV hardening followed by laser clearing of the emulsion 36. Alternately the emulsion 36 can be patterned and developed using UV exposure followed by development with a solvent such as water. In either case, a mask 38 (FIG. 5) formed of a thin flexible material, such as "mylar", is used to pattern the photosensitive emulsion 36.

With a laser development process the photosensitive emulsion 36 is initially hardened by exposure to a UV source. For example a photosensitive emulsion 36 formed in a negative tone can be hardened by exposure to intense ultra-violet light without any type of a mask. After hardening the emulsion 36, the mask 38 is placed in close proximity to the photosensitive emulsion 36 using a suitable apparatus such as an alignment and exposure tool. The mask 38 contains solid areas 42 and open areas 44 that form a negative (or alternately a positive) of the pattern that is ultimately transferred to the substrate 14 (FIG. 1). Such a mask 38 is typically referred to in the art as a phototool and contains the artwork for the screen printed pattern. The mask 38 can be made by techniques that are known in the art. Typically the artwork is performed and then reduced in size using a step and repeat process. The mask 38 can also be made larger than the ultimate pattern to be printed by placing a reduction lens 39 between the mask 38 and the emulsion 36.

Prior to patterning the photosensitive emulsion 36, the open areas 44 in the mask 38 are aligned with the screen openings 34. Alignment is effected such that the screen openings 34 and open areas 44 of the mask align along alignment axis 46. Alignment can be accomplished using a microscope, or other viewing device, to look through the open areas 44 of the mask 38 and through the photosensitive emulsion 36 to the screen openings 34. Because the photosensitive emulsion 36 is formed of a transparent or translucent material, it is possible to see through this material to the mesh 26. Using the viewing device and suitable tools (e.g., exposure and alignment tool), the location of the mask 38 is adjusted so that the open areas 44 on the mask are aligned with the screen openings 34.

With the open areas 44 of the mask 38 aligned with the screen openings 34, a laser light 40 is directed through the mask 38 to the emulsion 36. The laser light 40 can be focused onto the surface of the emulsion using suitable lenses associated with the laser. Depending on the emulsion 36, an excimer or $CO_2$ laser can be used to ablate and clear the emulsion 36 from the mesh 26. A laser can be operated at an energy level that couples well to the photosensitive polymers typically used for forming a patterning layer. In addition, with a laser, a uniform energy density can be maintained across a relatively large area (e.g., 1cm×1cm). The laser light 40 introduces localized heating and causes the photosensitive emulsion 36 to decompose and ablate in areas corresponding to the open areas 44 on the mask 38. This clears the photosensitive emulsion 36 from the mesh 26 in these areas. As the material is ablated the focus of the laser light 40 can be changed to maintain localized heating at the surface of the photosensitive emulsion 36. At the completion of the laser ablation process, and as clearly shown in FIG. 2, the patterning layer 28 is formed on the mesh 26 with open areas 30 of the patterning layer 28 aligned with the openings 34 in the mesh 26.

The pattern to be screen printed must be selected such that the locations of the open areas 42 on the mask 38 coincide as much as possible with the locations of the screen openings 34. In a simplified case, this can be accomplished by locating the features of the pattern to be screen printed, with a pitch (P1 or P2) for the features that is an integral multiple (i.e., whole multiple) of the pitch P of the screen openings 34. As an example, for a 400 mesh screen having a pitch P of 2.5 mils, the features for the pattern can be spaced with a pitch (P1 and P2) of 2.5 mils, 5.0 mils, 7.5 mils, 10.0 mils etc.

However, because of the previously discussed difficulties in forming a screen with a perfectly consistent pattern more sophisticated analytical methods can be used to select a mesh size for the mesh 26 that will produce the least amount of interference with a desired pattern.

One such method is illustrated with reference to FIGS. 6, 7A and 7B. In this example, a desired pattern to be printed on a substrate includes holes 30A (FIG. 7A). The holes 30A correspond to the open areas 30 previously described. The holes 30A are approximately 1 mil. in diameter on a 11.67 mil. (P1)×8.75 mil. (P2) pitch. In FIG. 7A, the position of a hole 30A is depicted with respect to a centerline 48 which represents the center of the screen openings 34. A left hand boundary represented by line 50 is spaced from the center line 48 by a distance equal to $-\frac{1}{2}$ the wire diameter ($\phi$). A right hand boundary represented by line 52 is spaced from the center line 48 by a distance equal to $+\frac{1}{2}$ diameter ($\phi$). In FIG. 7B, dimension "x" represents the horizontal offset of the hole 30A within the screen opening 34. Dimension "y" represents the vertical offset of the hole 30A within the screen opening 34. The following algorithm can be used to pick a suitable mesh size for a particular pattern. A screen is picked by how many holes 30A partially or totally align with the screen openings.

```
1. Psuedo Code
   Set hole spacing
   Set wire spacing
   Set wire diameter
2. Set Loop Parameters
   H_Row = # holes in a row in unit area
   H_Col = # holes in a column in unit area
3. Test For Intersection
   FLAG Row [H_Row] BOOLEAN
   FLAG Col [H_Col] BOOLEAN
   Wire Row [ ] FLOAT
   Wire Col [ ] FLOAT
   For (i = 1 to H_Row)
   Position = i x hole spacing - Hor
   for (K = 1 to N_Row)
   Center = k x wire spacing Hor + Hor Offset
   If (((Position < (Center + ½ wire ∅)) and
   ((Position > Center − ½ wire ∅))) FLAG Row
   [i] = FALSE
   Column Code is identical
4. Count the Tags
   For (i = 1 to Row)
      for (j = 1 to col)
         if (FLAG Col (j) and FLAG Row (i) = TRUE)
            Count = Count + 1
```

For the above specified pattern, and as shown in FIG. 6, good frequency matches between the mesh and pattern occur with an 80 mesh screen and with a 230 mesh screen. An 80 mesh screen formed with 2.0 mil. wire and 10.5 mil. screen openings will include 5355 openings/in$^2$. A 230 mesh screen formed with 1.4 mil. wire and 2.9 mil. screen openings will include 4116 openings/in$^2$. A 230 mesh screen formed with 1.1 mil. wire and 3.2 mil. open areas will include 4788 openings/in$^2$.

In general, fine mesh screens with a larger mesh size (e.g., 80 mesh) will include a larger total hole area than a very fine mesh screen (e.g., 400 mesh). For some patterns, a larger mesh screen is thus less likely to form a beat frequency wherein the frequency of the screen openings interferes with the frequency of the pattern openings. A pattern formed on a larger mesh screen is thus less likely to be completely blocked or misaligned due to non alignment of the screen wires in different areas of the screen.

Alternately in place of a laser ablation process to form the patterning layer 28, a UV exposure and development process can be used. In this case the photosensitive emulsion 36 in FIG. 5 is exposed by directing a UV light through the mask 38. The UV light would take the place of the laser light 40. The photosensitive emulsion 36 would then be developed using a suitable solvent such as water to form the patterning layer 28 (FIG. 2). For a negative acting photosensitive emulsion 36 (FIG. 5), the exposed portions of the emulsion are polymerized. Conversely, the unexposed portions of the photosensitive emulsion 36 are removed by the water jet to form the open areas 30 (FIG. 2).

One application for the method of the invention is in the fabrication of flat panel displays and field emitter devices (FEDs) for flat panel displays. By way of example, substrates formed as a silicon or glass member are used in the construction of baseplates for flat panel displays. Such a flat panel display includes spacer elements that are used to separate the baseplate from a display screen. The spacers are secured to the baseplate with an adhesive. Using the method of the invention, the features printed on the substrate 14 can be adhesive dots used for securing spacers of the flat panel display to the baseplate.

Thus the invention provides an improved method for forming a screen for screen printing and an improved method for screen printing. Although the method of the invention has been described with reference to certain preferred embodiments, as will be apparent to those skilled in the art, certain changes and modifications can be made without departing from the scope of the invention as defined by the following claims.

What is claimed is:

1. A method for forming a screen for screen printing a substrate, said method comprising:

providing a mesh including screen wires interwoven to form screen openings of a predetermined size and frequency;

depositing an emulsion on the mesh;

providing a mask having open areas spaced to form a desired pattern;

aligning the open areas of the mask with the screen openings by viewing the open areas and screen openings through a viewing device and adjusting a location of the mask or screen; and patterning the emulsion by directing a laser light through the mask to ablate the emulsion and form a pattern of openings therethrough in alignment with the screen openings.

2. The method as claimed in claim 1 and further comprising selecting the desired pattern such that a frequency of the open areas on the mask is an integral multiple of the frequency of the screen openings.

3. The method as claimed in claim 1 and further comprising selecting the mesh by determining a total number of screen openings on the mesh that at least partially align with the open areas on the mask and then comparing the total number to a second total number of screen openings on a second mesh that at least partially align with the open areas on the mask.

4. The method as claimed in claim 1 and further comprising forming the emulsion as a photosensitive emulsion.

5. The method as claimed in claim 1 and wherein the mesh has a mesh count of between about 80 to 500.

6. The method as claimed in claim 1 and wherein aligning the open areas of the mask with the screen openings is by adjusting the location of the screen or mask with an alignment tool.

7. The method as claimed in claim 1 and wherein the emulsion is translucent and the screen openings are viewed through the emulsion.

8. A method for forming a screen suitable for screen printing a pattern of features on a substrate, said method comprising:

providing a mesh having a mesh count of between about 80 to 500, said mesh including screen wires of a predetermined size interwoven to form screen openings of a predetermined size and pitch;

forming a translucent photosensitive emulsion on the mesh;

forming a mask having open areas and solid areas corresponding to a desired pattern;

aligning the mask with the mesh by viewing the open areas and the screen openings and adjusting a location of the mask or screen so that the open areas of the mask align with the screen openings; and patterning the photosensitive emulsion using the mask to form a patterning layer on the mesh including openings aligned with the screen openings.

9. The method as claimed in claim 8 and wherein patterning is by exposing the emulsion with UV energy directed through the mask and then developing the emulsion with a solvent.

10. The method as claimed in claim 8 and wherein patterning is by directing a laser light through the open areas of the mask to clear the emulsion from the mesh to form the patterning layer.

11. The method as claimed in claim 8 and further comprising to selecting the desired pattern such that a frequency of the open areas on the mask is an integral multiple of the frequency of the screen openings.

12. The method as claimed in claim 8 and wherein aligning the open areas of the mask with the screen openings is by viewing the open areas and screen openings through a viewing device and adjusting the location of the screen or mask with an alignment tool.

13. The method as claimed in claim 8 and wherein the photosensitive emulsion is a negative tone polymer that is hardened prior to patterning.

14. A method for forming a screen suitable for screen printing a pattern of features onto a substrate, said method comprising:

providing a mesh having a mesh count between about 80–500, said mesh including screen openings spaced apart by a predetermined pitch and an emulsion formed on the mesh;

providing a mask having open areas and solid areas corresponding to the pattern, said open areas spaced apart by an integral multiple of the pitch;

aligning the mask with respect to the mesh by viewing the open areas and screen openings and adjusting a location of the mesh or the mask so that the open areas on the mask align with the screen openings; and patterning the emulsion by directing a laser light through the mask to ablate the emulsion and form a patterning layer on the mesh having openings aligned with the screen openings.

15. The method as claimed in claim 14 and wherein the mask comprises a phototool.

16. The method as claimed in claim 14 and wherein the step of adjusting the location of the mesh or mask is with an exposure and alignment tool.

17. The method as claimed in claim 14 and wherein the emulsion is translucent and the screen openings are viewed through the emulsion.

18. The method as claimed in claim 14 and wherein the features are adhesive dots screen printed onto the substrate.

19. A method for forming a screen for screen printing, said method comprising the steps of:

providing a mesh having a mesh count of from 80–500, said mesh including screen openings spaced apart by a predetermined pitch;

depositing an emulsion on the mesh;

providing a mask having open areas and solid areas corresponding to a pattern, said open areas spaced apart by an integral multiple of the pitch;

aligning the mask with respect to the mesh by viewing the open areas and screen openings through a viewing device and adjusting a location of the mesh or mask with an alignment tool so that the open areas on the mask align with the screen openings; and patterning the emulsion using the aligned mask to form a patterning layer on the mesh having openings aligned with the screen openings.

20. The method as claimed in claim 19 and wherein the mask is formed as a phototool an patterning the emulsion is by directing a laser through the mask to ablate the emulsion.

21. The method as claimed in claim 19 and wherein the emulsion is translucent.

22. The method as claimed in claim 19 and further comprising selecting the mesh by determining a total number of holes on the mesh that at least partially align with the open areas on the mask and then comparing the total number to a second total number of screen openings on a second mesh that at least partially align with the open areas on the mask.

* * * * *